United States Patent
Buechele et al.

[19]

[11] Patent Number: 6,132,510
[45] Date of Patent: *Oct. 17, 2000

[54] NOZZLE APPARATUS FOR EXTRUDING CONDUCTIVE PASTE

[75] Inventors: Alvin Wilbur Buechele, Clinton Corners; John Thomas Butler, Hopewell Junction; Karl Otto Muggenburg, Salt Point, all of N.Y.; Mark Gerard Reichel, Manassas, Va.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/753,129

[22] Filed: Nov. 20, 1996

[51] Int. Cl.$^7$ ........................................................ B05D 3/02
[52] U.S. Cl. ........................... 118/213; 118/126; 118/406; 118/410; 222/389
[58] Field of Search ..................... 118/406, 213, 118/504, 123, 126, 410; 101/119, 120, 124, 125, 129; 427/282; 222/61, 389, 590, 593, 594; 401/266

[56] References Cited

U.S. PATENT DOCUMENTS

| | | | |
|---|---|---|---|
| 3,949,666 | 4/1976 | Zimmer | 101/119 |
| 3,987,724 | 10/1976 | Zimmer | 101/119 |
| 4,604,678 | 8/1986 | Hagner | 361/401 |
| 4,622,239 | 11/1986 | Schoenthaler et al. | 427/96 |
| 4,636,406 | 1/1987 | Leicht | 427/96 |
| 4,665,723 | 5/1987 | Zimmer | 68/200 |
| 4,693,209 | 9/1987 | Leicht | 118/213 |
| 5,184,399 | 2/1993 | Ueno et al. | 29/846 |
| 5,294,459 | 3/1994 | Hogan et al. | 427/96 |
| 5,308,644 | 5/1994 | Kawakami et al. | 427/96 |
| 5,350,600 | 9/1994 | Kubota | 427/256 |
| 5,387,044 | 2/1995 | Accardo | 401/5 |
| 5,478,700 | 12/1995 | Gaynes et al. | 430/315 |

OTHER PUBLICATIONS

S. W. Cornell, et al., "Extrusion Screening Nozzle", IBM Technical Disclosure Bulletin vol. 14, No. 3, Aug. 1971, p. 739.

Primary Examiner—Fred J. Parker
Attorney, Agent, or Firm—Daryl K. Neff, Esq.

[57] ABSTRACT

A nozzle apparatus and method of use for extruding a conductive paste through a stencil or screen onto a substrate are disclosed. The nozzle includes a body and a conformable insert for contacting the screen. The method comprises the steps of obtaining a substrate and a patterned screen, contacting the screen with a nozzle comprising a nozzle body and a conformable nozzle insert, and extruding a paste through the nozzle and screen onto the substrate. The apparatus and method are particularly useful for producing patterned lines from extruded pastes in the manufacture of microelectronic components.

18 Claims, 4 Drawing Sheets

NOZZLE APPARATUS FOR EXTRUDING CONDUCTIVE PASTE

RELATED APPLICATION

Copending U.S. patent application Ser. No. 08/753,127, entitled "Nozzle Apparatus for Extruding Conductive Paste" filed on even date herewith and assigned to the assignee hereof, discloses a similar nozzle apparatus and method of use.

BACKGROUND OF THE INVENTION

1. Field of the Invention

This invention generally relates to the field of coating apparatus for conductive pastes, and more particularly, to a method and apparatus for extruding a conductive paste through a stencil or screen.

2. Discussion of Related Art

In the fabrication of substrates and carriers for microelectronic components such as integrated circuit chips, the screen printing of lines of conductive paste onto substrates or sheets is a well known technique. In practice, a mask is placed in intimate contact with a substrate, and a conductive paste is then applied. Screening masks are typically thin sheets of metal such as molybdenum, steel, or copper, having a pattern of voids or openings through which the paste is passed. The voids correspond to the desired pattern of lines to be formed on a device.

There are several well known, general, techniques for applying conductive paste. For example, conductive paste may be deposited in a puddle or mass on screening mask, and a squeegee blade moved across the mask to force the paste into the stencil openings and on to the substrate. Alternatively, the screening mask is contacted with a nozzle having an elongate opening for extruding paste into the stencil openings. The nozzle may comprise an integral squeegee blade for wiping, or a separate blade may be used.

Nozzles and methods for their use are also known. The following references illustrate the state of the pertinent art.

U.S. Pat. No. 4,622,239 to Schoenthaler, et al., discloses a nozzle apparatus having elastomeric blades.

U.S. Pat. Nos. 4,636,406 and 4,693,209 to Leicht disclose a method and nozzle apparatus for dispensing solder paste.

U.S. Pat. No. 4,665,723 to Zimmer discloses a nozzle apparatus for dispensing a liquid on a moving web.

U.S. Pat. No. 5,387,044 to Accardo discloses a nozzle apparatus comprising a removable squeegee blade.

U.S. Pat. No. 5,478,700 to Gaynes, et al., discloses a nozzle apparatus having a pair of flexible nozzle lips.

Finally, S. W. Cornell, et al., disclose in the IBM Technical Disclosure Bulletin, Vol. 14(3), 739, (August 1971) a nozzle apparatus having a Teflon nozzle insert.

Much of the prior art has certain deficiencies or disadvantages. One disadvantage is damage and wear to masks caused when hard materials are used to fabricate the contacting element of some nozzles. Another disadvantage is the high cost associated with fabricating nozzle contacting elements to very tight tolerances to maintain an effective extrusion seal. A third disadvantage is the loss of paste through nozzle end leakage during screening. Additionally, many known nozzle designs necessitate continuous rapid cleaning and drying of masks after screening in a separate step.

It would thus be desirable to provide an improved nozzle apparatus and method for use provides a solution to the aforesaid and other deficiencies and disadvantages.

SUMMARY OF THE INVENTION

An object of the present invention is to overcome the problems in the art discussed above.

Another object of the present invention is to provide an improved nozzle apparatus which includes a body and a conformable insert for contacting the screen surface at the point of use.

Yet another object of the present invention is to provide a nozzle apparatus which avoids the very tight manufacturing tolerances previously required.

Yet another object of the present invention is to provide a nozzle apparatus which is easier to fabricate than previous designs.

Yet another object of the present invention is to provide a nozzle apparatus which forms a positive seal against the screen or mask to reduce paste waste.

Yet another object of the present invention is to provide a nozzle apparatus which functions as a dry wipe nozzle, wherein after a first screening, the mask remains sufficiently clean to screen upon it again.

Still yet another object of the present invention is to provide a method for the use of such nozzle apparatus.

Thus, according to the present invention, a nozzle for extruding a paste through a screen and onto a substrate comprises the elements of:

(a) a nozzle body having an inlet, an elongate outlet formed to receive an insert, and an internal passage in communication therewith; and (b) an insert formed to compliantly and sealably mount to the nozzle body outlet, having a flat surface for conformably contacting the screen, and having an elongate slit therein for the extrusion of paste.

In addition, according to the present invention, a method for producing at least one patterned feature of extruded paste on a substrate comprises the steps of:

(a) obtaining a substrate having a patterned screen thereon;

(b) contacting the screen with a nozzle comprising a nozzle body having an inlet, an elongate outlet formed to receive an insert, and an internal passage in communication therewith, and a nozzle insert formed to compliantly and sealably mount to the nozzle body outlet, having a flat surface for conformably contacting the screen, and having an elongate slit therein for the extrusion of paste; and (c) extruding a paste through the nozzle and screen onto the substrate.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, in which.

DETAILED DESCRIPTION OF THE PREFERRED EMBODIMENTS

U.S. patent application Ser. No. 08/753,127, abandoned, entitled "Nozzle Apparatus for Extruding Conductive Paste" (attorney docket number FI9-96-143) discloses a similar nozzle apparatus and method of use. The disclosure thereof is incorporated by reference into this application.

Figure 1:
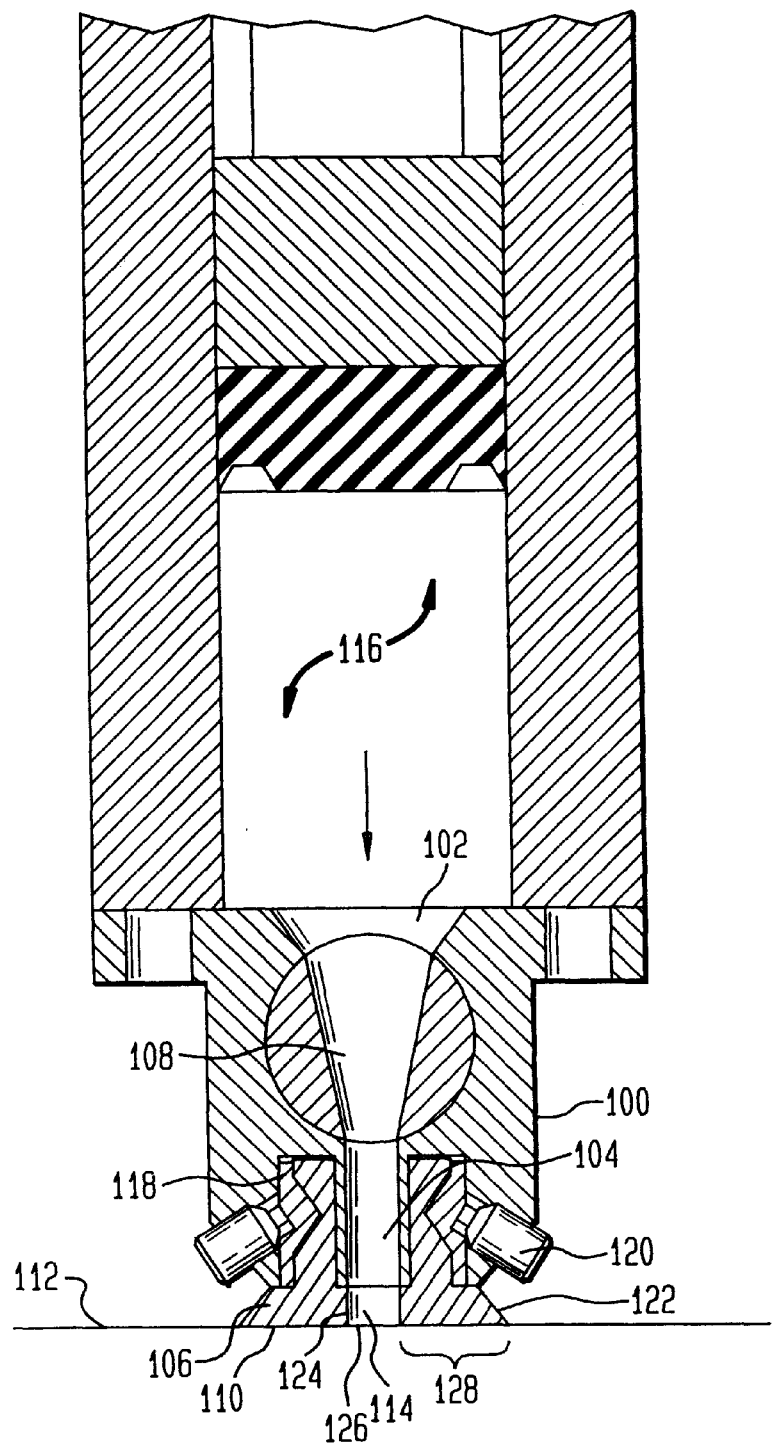
FIG. 1 shows a cross sectional end view of a nozzle body, nozzle insert, and support strips according to the present invention.

Referring to FIG. 1, there is shown an improved nozzle for extruding a paste through a screen and onto a substrate according to the present invention. The nozzle comprises a nozzle body 100 having an inlet (not shown), an elongate outlet 104 formed to receive a nozzle insert 106, and an internal passage 108 in communication with the inlet and outlet 104. The nozzle further comprises the nozzle insert 106, which is formed to compliantly and sealably mount to the nozzle body outlet 104. The insert has a contacting surface 110, which in the embodiment shown in FIG. 1 is flat, for conformably contacting the screen 112. The insert has an elongate slit 114 for the extrusion of paste 116. The insert 106 may comprise a material such as polyurethane, an elastomer, a thermoplastic, natural rubber, silicone, TEFLON™, or other similar polymers. The nozzle may optionally comprise a plurality of support strips 118 fixably mounted in the nozzle body 100 to retain the insert 106 in the nozzle body 100. The support strips 118 may be fixably mounted by many well known means including set screws 120, glues (not shown), or various other bonding means. Alternatively, the insert 106 may be fixably mounted without the use of support strips 118, such as by gluing or bonding directly to the nozzle body 100.

Figure 2:
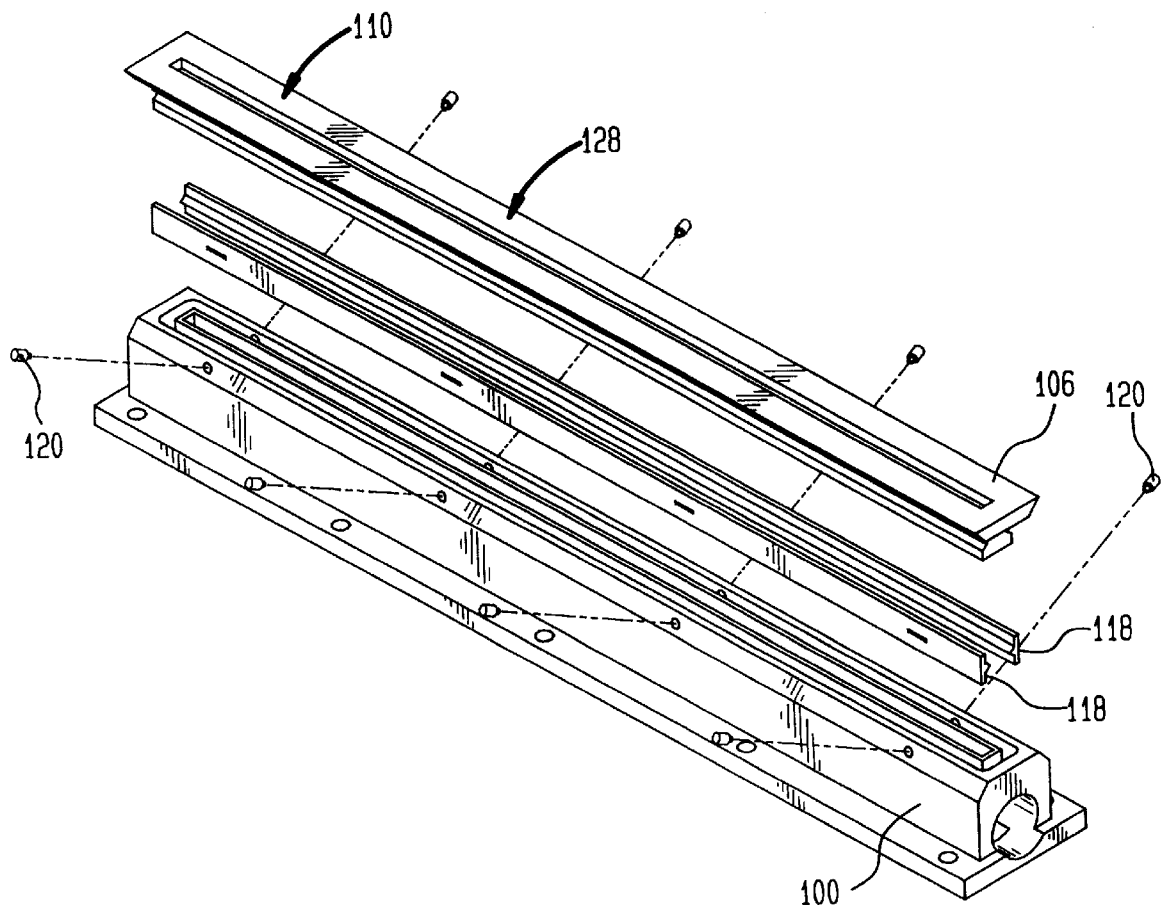
FIG. 2 shows a partial perspective, exploded view of a nozzle body, support strips, and nozzle insert, and particularly shows the flat surface for contacting a screen, according to the present invention.

FIG. 2 shows an alternate view of one embodiment of a nozzle according to the invention. Shown is a nozzle body 100 having an elongate outlet 104 formed to receive a nozzle insert 106. The nozzle insert 106 is formed to compliantly and sealably mount to the nozzle body outlet 104. FIG. 2 particularly shows the flat surface 110, and elongate slit 114. FIG. 2 further shows the optional plurality of support strips 118 fixably mounted in the nozzle body 100 by means of set screws 120 to retain the insert 106.

In operation, the nozzle may be used to produce at least one patterned feature of extruded paste on a substrate according to the following process. A substrate having a patterned screen thereon is obtained; both are well known in the art. The nozzle assembly is brought proximate to the screen such that the nozzle insert contacts the screen to form a seal between the insert and screen. Paste is then extruded through the elongate slit in the nozzle insert so as to pass through the screen and patterwise onto the substrate.

Referring back to FIG. 1, there is further shown a preferred embodiment of the insert 106 which has at least one beveled working edge 122.

In yet another preferred embodiment, the insert 106 has an internal cavity wall 124 which is essentially perpendicular to the flat surface 110. It is even more preferred that the cavity wall 124 terminates at a sharp point 126 at the plane of contact with the screen 112.

In an alternative even more preferred embodiment, the insert flat surface 110 comprises a region 128 extending beyond each end of the elongate opening 114 to dynamically seal to the screen 112.

Figure 3:
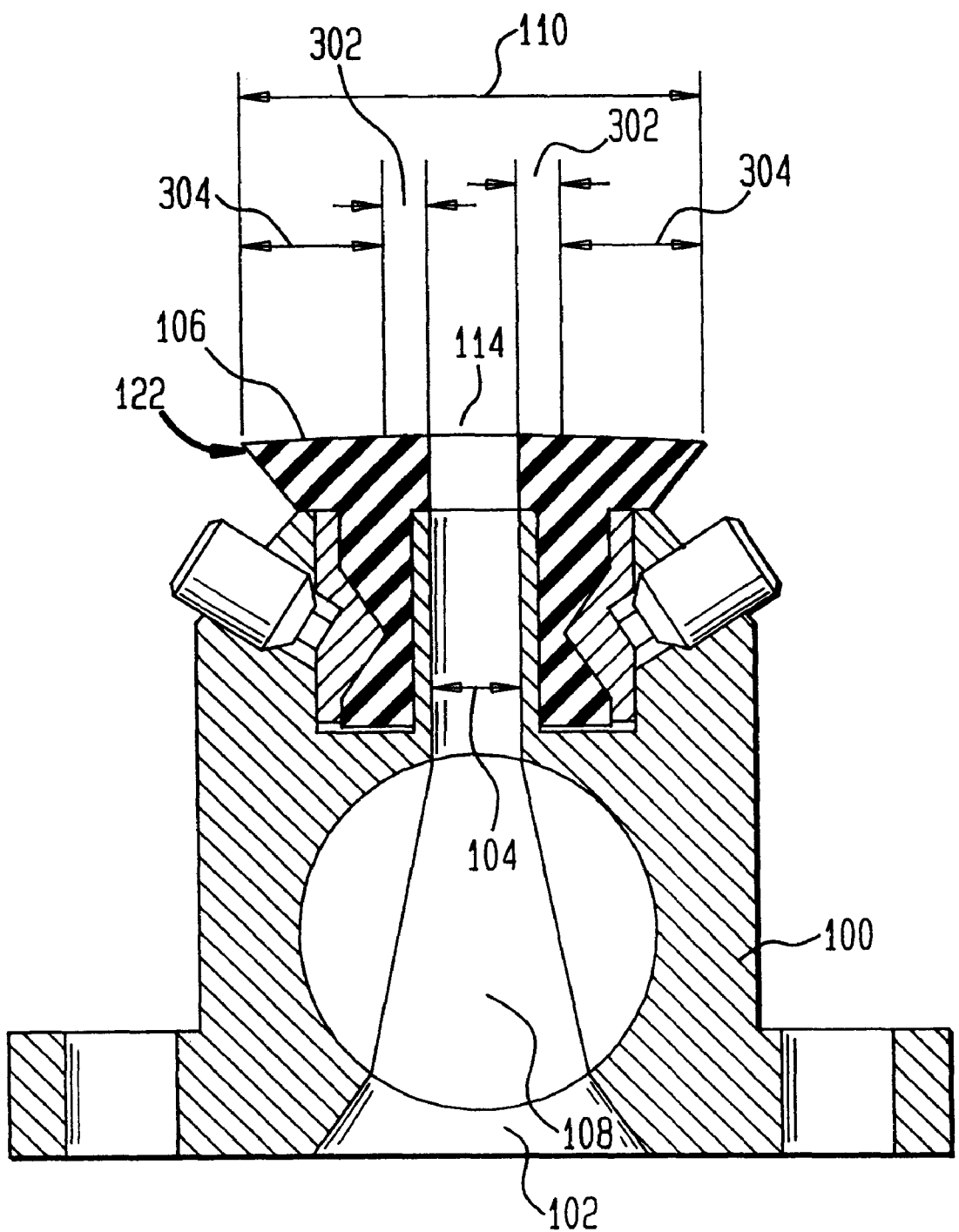
FIG. 3 shows a cross sectional end view of a nozzle body, the nozzle insert of a preferred embodiment, and support strips according to the present invention.

Another even more preferred embodiment is shown in FIG. 3, wherein the nozzle comprises a nozzle body 100, having an inlet 102, an elongate outlet 104 formed to receive a nozzle insert 106, and an internal passage 108 in communication with the inlet and outlet 104. The nozzle insert 106 is also shown, and is formed to compliantly and sealably mount to the nozzle body outlet 104. The insert has a contacting surface 110 comprising a first flat region 302 extending from the opening 114 towards the beveled working edge 122, and a second surface 304 which is angled. To further illustrate but not limit such an embodiment, the first flat region 302 may have a width in the range from about 0.020 inches to about 0.060 inches, and the second surface 304 may be disposed at an angle of about 2 to about 4 degrees from the first surface 302. A nozzle insert of such design has been unexpectedly found to improve the consistency of the nozzle to screening mask seal and to increase the effective life of a nozzle insert.

Figure 4:
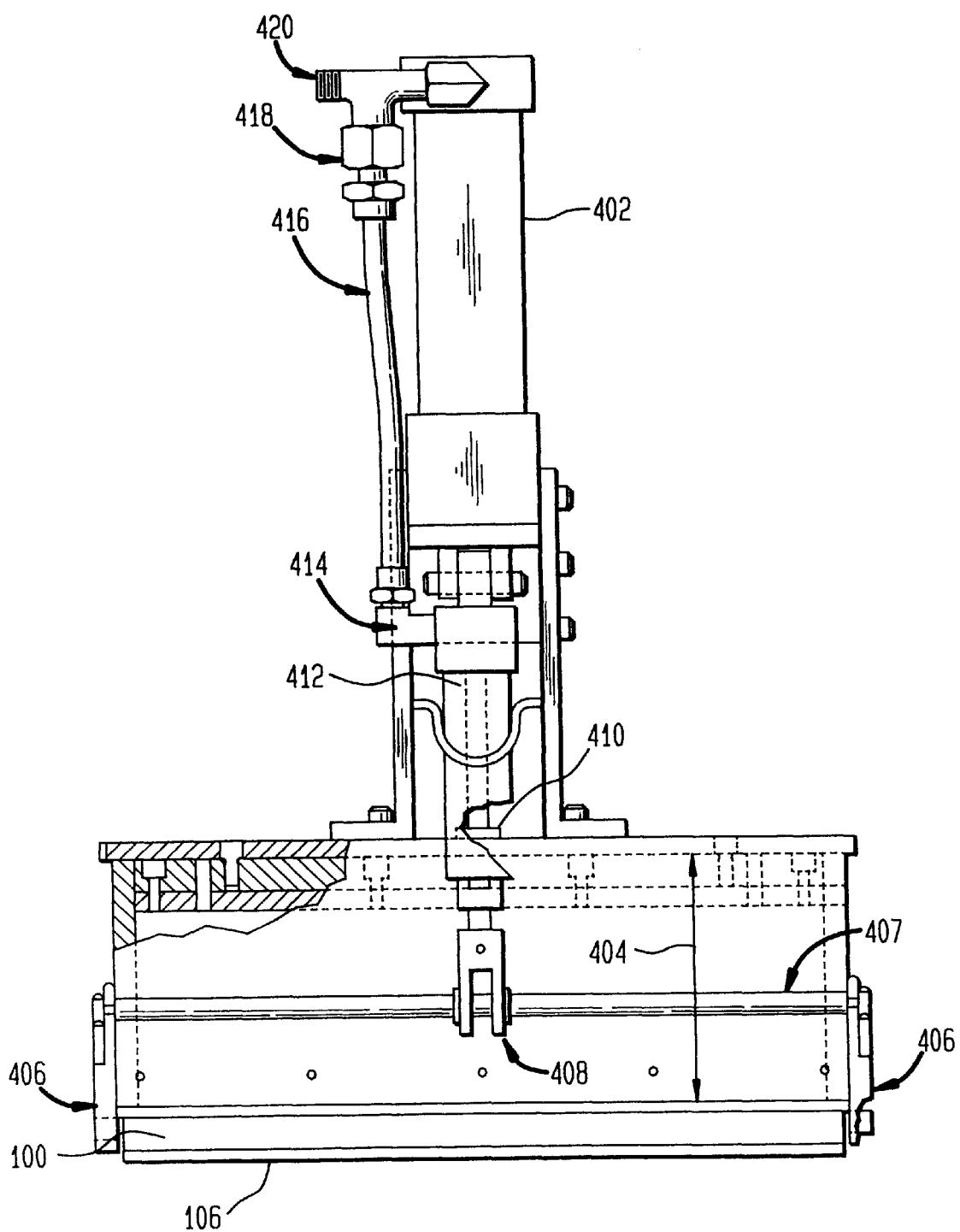
FIG. 4 shows a side external view of a nozzle body, nozzle insert, paste supply means and paste flow controlling apparatus according to the present invention.

The nozzle is useful as a component in a paste extrusion apparatus. FIG. 4 shows a portion of one such representative extrusion apparatus. More particularly, in FIG. 4, there is shown a side view of a nozzle body 100, a paste supply means comprising extrusion cylinder 402 and a paste reservoir 404. The apparatus may also comprise a paste flow control means comprising, for example, a rotatably- and sealably- mounted shutter within the nozzle body 100 to permit or shut off paste flow, one or more shutter actuating links 406 having one end fixed to and rotating with the shutter and the other end swivelably mounted on rod member 407, clevis 408, piston assembly 410, air cylinder 412, elbow 414, tubing 416, connector 418, and tee 420. It will be understood that, in operation, the shutter is opened, extrusion cylinder 402 is extended to exhaust paste reservoir 404 in response to pressure exerted by a piston within cylinder 402, nozzle insert 106 is brought into contact with a bulk supply of paste, extrusion cylinder 402 is retracted to draw paste through nozzle insert 106 and nozzle body 100 into paste reservoir 404, and the shutter may then optionally be closed. The paste filled apparatus is then positioned so as to contact nozzle insert 106 with a screen 112, if previously closed, the shutter is opened, and the paste is extruded through the nozzle body 100 and insert 106 in response to pressure exerted by a piston within cylinder 402. It will be understood that the paste supply means and paste flow control means are merely illustrative of one embodiment, and that the artisan will appreciate that many other paste supply means and paste flow control means will be useful with the nozzle of the present invention.

While the invention has been particularly shown and described with reference to specific embodiments thereof, it will be understood by those skilled in the art that various changes in form and detail may be made thereto, and that other embodiments of the present invention beyond embodiments specifically described herein may be made or practiced without departing from the spirit of the invention. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A system for selectively applying a paste to an essentially planar microelectronic substrate having high aspect ratio openings, said substrate being an integrated circuit or integrated circuit carrier component, comprising:

a flat screen having openings for conducting said paste to said substrate; and a paste extruding nozzle including:

a nozzle body, said nozzle body having an inlet, an elongate outlet formed to receive an insert, and an internal passage in communication therewith; and a pliant insert formed to compliantly and sealably mount to said nozzle body outlet, said pliant insert having an elongate slit for the extrusion of paste through said nozzle body outlet and said screen onto said substrate, a flat surface located adjacent to said slit and contacting said flat screen, and a second surface joined to said flat surface at a position not in contact with said slit and angled between about 2 and about 4 degrees from said flat surface towards said nozzle body, said pliant insert establishing a positive and consistent seal to said flat screen during the application of said paste.

2. The nozzle of claim 1 further comprising a plurality of support strips fixably mounted in the nozzle body to retain the insert in the nozzle body.

3. The nozzle of claim 2 wherein the plurality of support strips are fixably mounted in the nozzle body by set screws.

4. The nozzle of claim 2 wherein the plurality of support strips are fixably mounted in the nozzle body by glue.

5. The nozzle of claim 2 wherein the plurality of support strips are bonded to at least one of the nozzle body and the insert.

6. The nozzle of claim 1 wherein the insert has an internal cavity wall and wherein the cavity walls are essentially perpendicular to the flat surface.

7. The nozzle of claim 1 wherein one or more lateral edges of said insert are beveled.

8. The nozzle of claim 1 wherein the insert comprises a material selected from the group consisting of elastomers and thermoplastics.

9. The nozzle of claim 1 further comprising a paste flow control means.

10. The nozzle of claim 1 further comprising a paste supply means.

11. The nozzle of claim 2 wherein said nozzle is formed of a pliant material and said support strips retain said pliant insert against deformation during use.

12. The system of claim 1 further comprising a plurality of support strips fixably mounted in said nozzle body to retain said insert in said nozzle body.

13. The system of claim 12 wherein said angled second surface terminates in a beveled edge.

14. A system for selectively applying a paste to an essentially planar microelectronic substrate having high aspect ratio openings, said substrate being an integrated circuit or integrated circuit carrier component, comprising:

a flat screen having openings for conducting said paste to said substrate; and a paste extruding nozzle including:

a nozzle body having an elongate outlet; and a pliant member sealably mounted to said nozzle body, said pliant member having an elongate slit for the extrusion of paste through said nozzle body outlet and said screen onto said substrate, a flat surface located adjacent to said slit and contacting said flat screen, and a second surface joined to said flat surface at a position not in contact with said slit and angled between about 2 and about 4 degrees from said flat surface towards said nozzle body, said pliant member establishing a positive and consistent seal to said flat screen during the application of said paste.

15. The system of claim 14 wherein said pliant member is bonded to said nozzle body.

16. The system of claim 14 wherein said pliant member has at least one beveled working edge.

17. The system of claim 14 wherein said flat surface has width in a range between about 0.020 inches to about 0.060 inches.

18. The system of claim 14 wherein said pliant member comprises a material selected from the group consisting of elastomers and thermoplastics.

* * * * *